US008563405B2

United States Patent
Chang

(10) Patent No.: US 8,563,405 B2
(45) Date of Patent: Oct. 22, 2013

(54) METHOD FOR MANUFACTURING SEMICONDUCTOR DEVICE

(75) Inventor: Wen-Hsiung Chang, Hsinchu (TW)

(73) Assignee: Ineffable Cellular Limited Liability Company, Wilmington, DE (US)

( * ) Notice: Subject to any disclaimer, the term of this patent is extended or adjusted under 35 U.S.C. 154(b) by 0 days.

(21) Appl. No.: 12/774,795

(22) Filed: May 6, 2010

(65) Prior Publication Data

US 2011/0275194 A1 Nov. 10, 2011

(51) Int. Cl.
*H01L 21/00* (2006.01)
*H01L 21/44* (2006.01)
*H01L 21/50* (2006.01)

(52) U.S. Cl.
USPC ..... 438/464; 438/110; 438/672; 257/E21.499

(58) Field of Classification Search
USPC ................. 438/464, 672, 694, 106–114; 257/E21.499
See application file for complete search history.

(56) References Cited

U.S. PATENT DOCUMENTS

| 7,226,873 | B2 * | 6/2007 | Yen et al. ................ 438/781 |
| 7,888,238 | B2 * | 2/2011 | Wakisaka et al. ........... 438/462 |
| 2001/0005043 | A1 * | 6/2001 | Nakanishi et al. .......... 257/678 |
| 2002/0034860 | A1 | 3/2002 | Miyamoto et al. |
| 2002/0048907 | A1 | 4/2002 | Miyamoto et al. |
| 2009/0115042 | A1 * | 5/2009 | Koyanagi .................. 257/686 |
| 2009/0206478 | A1 * | 8/2009 | Chen et al. ................ 257/737 |

FOREIGN PATENT DOCUMENTS

TW 544739 8/2003

* cited by examiner

*Primary Examiner* — Calvin Choi

(57) ABSTRACT

A method for manufacturing semiconductor device includes the following steps. First, a carrier substrate and a plurality of pieced segments of wafer are provided. Each of the pieced segments of wafer has an active surface and a back surface on opposite sides thereof. Further, there is at least a bonding pad disposed on the active surface. Next, an adhering layer is formed between the carrier substrate and the active surfaces of the pieced segments of wafer, so as to make the pieced segments of wafer adhere to the carrier substrate. Next, a through silicon via is formed in each of the pieced segments of wafer to electrically connect to the bonding pad correspondingly. Then, the pieced segments of wafer are separated from the carrier substrate.

14 Claims, 6 Drawing Sheets

METHOD FOR MANUFACTURING SEMICONDUCTOR DEVICE

BACKGROUND

1. Field of the Invention

The present invention relates to a semiconductor process, and more particularly to a method for manufacturing semiconductor device.

2. Description of the Related Art

Generally, an entire wafer is a basic processing unit in semiconductor processing equipment. The entire wafer has some regions with undesired electricity or structure due to the faults of manufacturing process of the wafer. If a wafer has many regions with undesired electricity or structure and the follow-up process is performed to the entire wafer, productivity of the processing equipment would be decreased excessively due to the ineffective work of these undesired regions, and the production cost may be increased and the production efficiency may be decreased.

BRIEF SUMMARY

The present invention is directed to a method for manufacturing semiconductor device, which can reduce the production cost and enhance the production efficiency.

The present invention provides a method for manufacturing semiconductor device. The method includes the following steps. First, a carrier substrate and a plurality of pieced segments of wafer are provided. Each of the pieced segments of wafer has an active surface and a back surface on opposite sides thereof. Further, there is at least a bonding pad disposed on the active surface. Next, an adhering layer is formed between the carrier substrate and the active surfaces of the pieced segments of wafer, so as to make the pieced segments of wafer adhere to the carrier substrate. Next, a through silicon via is formed in each of the pieced segments of wafer to electrically connect to the bonding pad correspondingly. Then, the pieced segments of wafer are separated from the carrier substrate.

In one embodiment, the adhering layer can be patterned to distribute between the carrier substrate and the pieced segments of wafer.

In one embodiment, after separating the pieced segments of wafer from the carrier substrate, each of the pieced segments of wafer are further cut.

In one embodiment, a method for separating the pieced segments of wafer from the carrier substrate can include irradiating the adhering layer by ultraviolet light, hot melting the adhering layer, mechanical stripping the adhering layer or dissolving the adhering layer by a solvent.

In one embodiment, a method for forming the through silicon vias includes: forming at least a through hole in each pieced segments of wafer; forming a dielectric layer on the back surfaces of the pieced segments of wafer, the dielectric layer filled in the through holes; and removing a portion of the dielectric layer in the through holes, so as to expose the bonding pads; and filling a metallic layer into the through holes to form the through silicon vias electrically connecting to the bonding pads.

In one embodiment, the pieced segments of wafer can be provided by providing a wafer having a usable region and an undesirable region firstly. Then, the wafer is cut along the usable region, so as to obtain the pieced segments of wafer.

In one embodiment, the carrier substrate can be a transparent substrate.

In one embodiment, before forming the through silicon vias, the pieced segments of wafer can be further thinned.

In the method for manufacturing semiconductor device of the present invention, the pieced segments of wafer can come from the usable region of the wafer firstly, and then the pieced segments of wafer are adhered to the carrier substrate correspondingly to the existing process equipment by adhering layer, so as to carry out the subsequent manufacturing process. That is the method of the present invention can carry out the subsequent manufacturing process only to the usable region of the wafer. Therefore, the production cost can be reduced, and the production efficiency can be enhanced.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

FIGS. 1A to 1H are cross-sectional schematic views of a semiconductor device at stages in a manufacturing process according to an embodiment of the present invention.

Figure 1A:
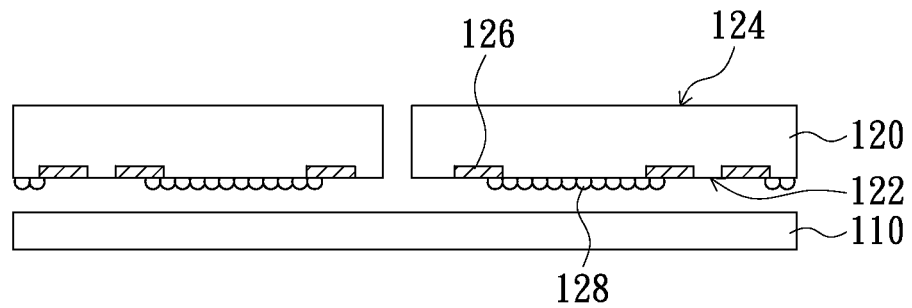
FIGS. 1A to 1H are cross-sectional schematic views of a semiconductor device at stages in a manufacturing process according to an embodiment of the present invention.

Referring to FIG. 1A, first, a carrier substrate 110 and a plurality of pieced segments of wafer 120 are provided. The carrier substrate 110 can be a transparent circular substrate, so as to correspond to existing process equipment. Each of the pieced segments of wafer 120 has an active surface 122 and a back surface 124 on opposite sides thereof. Moreover, there is at least a bonding pad 126 disposed on the active surface 122. Specifically, the bonding pads 126 are electrically connected with circuits (not shown) on the active surfaces 122 of the pieced segments of wafer 120. In addition, each of the pieced segments of wafer 120 has at least a semiconductor element 128, which can be electrically connected with an external circuit via the circuit and the bonding pad 126. In the embodiment, the semiconductor element 128 can be a micro lens array or a color filter array.

Figure 2A:
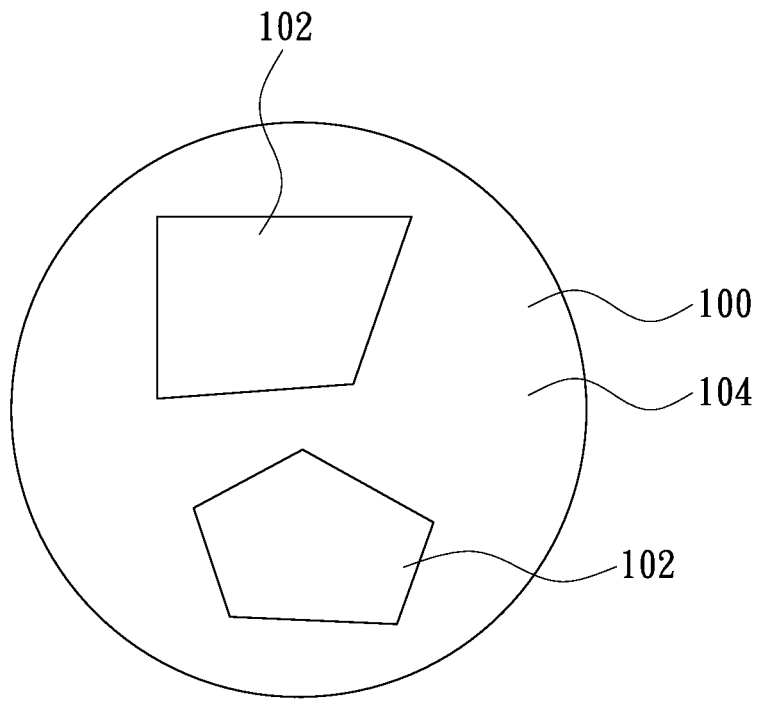
FIGS. 2A to 2B are schematic views of pieced segments of wafer at stages in a manufacturing process according to an embodiment of the present invention.
Figure 2B:
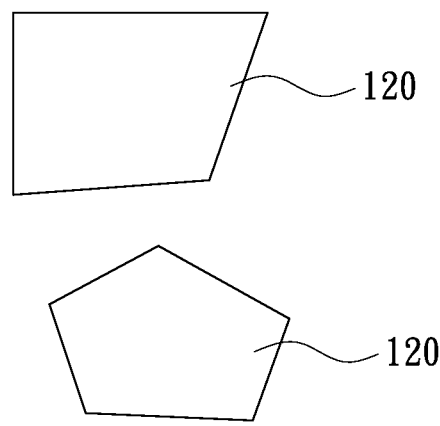

It should be noted that, the pieced segments of wafer 120 can be obtained from the same wafer or different wafers. In detail, referring to FIG. 2A, in the embodiment, first, a wafer 100 having a usable region 102 and an undesirable region 104 is provided. And then, referring to FIG. 2B, the wafer 100 is cut along the usable region 102, so as to obtain the pieced segment of wafer 120. In other words, the pieced segment of wafer 120 is obtained by cutting the usable region 102 of the wafer 100.

Figure 1B:
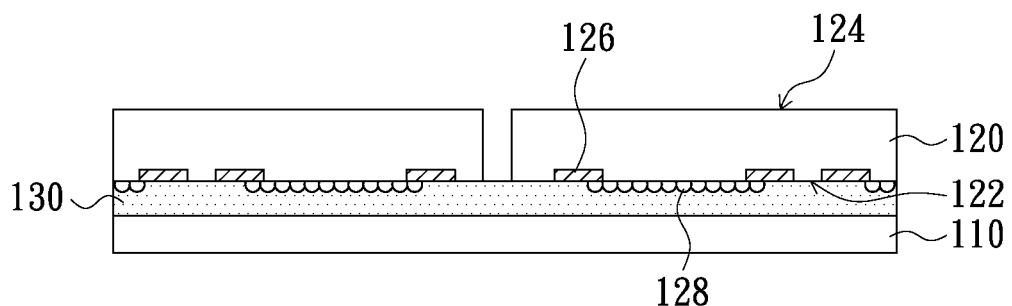

Referring to FIG. 1B, an adhering layer 130 is formed between the carrier substrate 110 and the active surfaces 122 of the pieced segments of wafer 120, so that the pieced segments of wafer 120 may adhere to the carrier substrate 110. In the embodiment, the adhering layer 130 may spread between the carrier substrate 110 and the active surfaces 122 of the pieced segments of wafer 120 completely. Furthermore, the adhering layer 130 can be an adhering layer having a temporary adhesive effect. For example, the adhering layer 130 can be made of ultraviolet adhesive, hot melt adhesive or dissolvable adhesive that may be dissolved by a solvent, but the invention is not limited hereto.

Figure 1C:
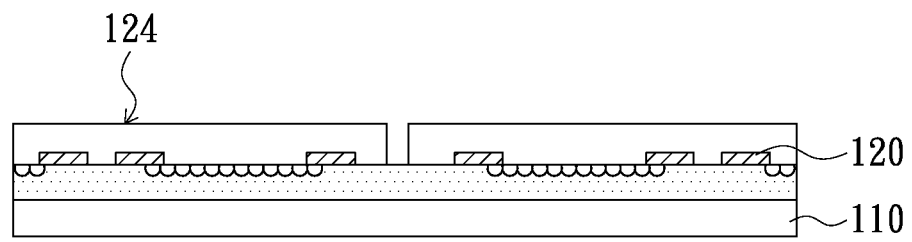

Referring to FIG. 1C, the pieced segments of wafer 120 are thinned from the back surfaces 124, so as to reduce thickness of each pieced segment of wafer 120. In the embodiment, after the pieced segments of wafer 120 are thinned, the thickness of each of the pieced segment of wafer 120 can be in a range from 100 microns to 200 microns.

Figure 1D:
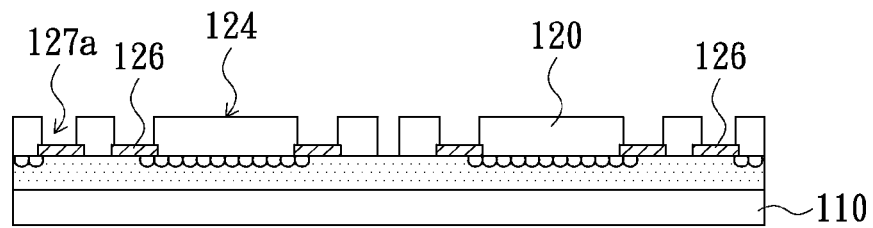
Figure 1E:
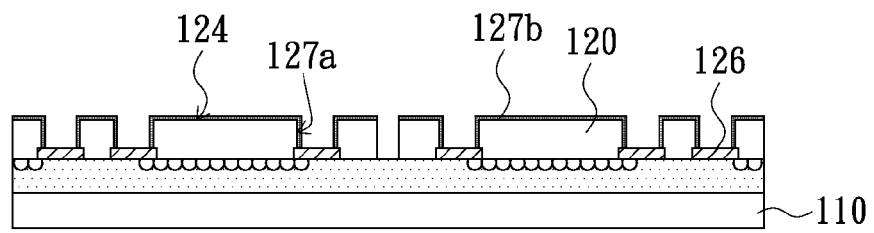
Figure 1F:
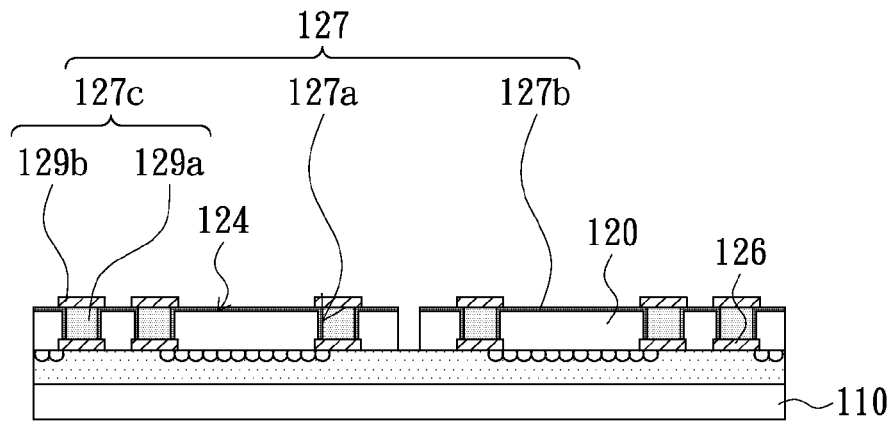

Referring to FIG. 1D through FIG. 1F, at least a through silicon via 127 is formed in each of the pieced segments of wafer 120 to electrically connect the bonding pad 126. Specifically, the through silicon vias 127 are formed by forming through holes 127a in each pieced segments of wafer firstly, as shown in FIG. 1D. The through holes 127a can be formed by laser drilling or deep reactive ion etching (DRIE).

Then referring to FIG. 1E, a dielectric layer 127b is formed on the back surfaces 124 of the pieced segments of wafer 120 and is filled in the through holes 127a. And then a portion of the dielectric layer 127b in the through holes 127a and on surfaces of the bonding pads 126 is removed to expose the bonding pads 126. In the embodiment, the dielectric layer 127b can be made of silicon dioxide. Further, the portion of the dielectric layer 127b can be removed by laser etching or deep reactive ion etching.

Figure 3A:
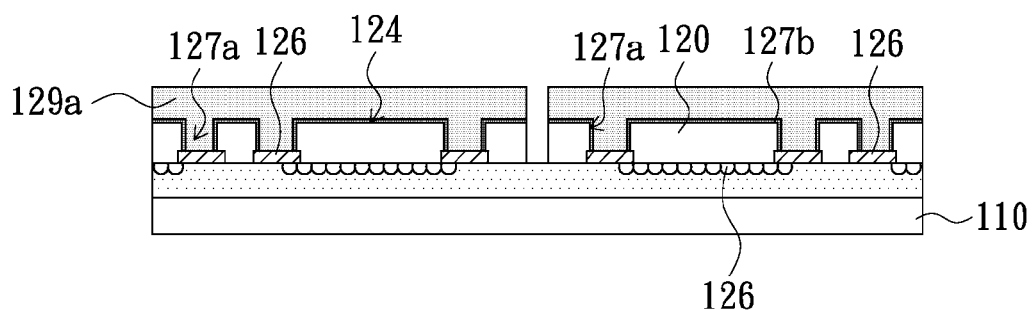
FIGS. 3A to 3B are cross-sectional schematic views of metallic wires forming in through holes at stages in a manufacturing process according to an embodiment of the present invention.
Figure 3B:
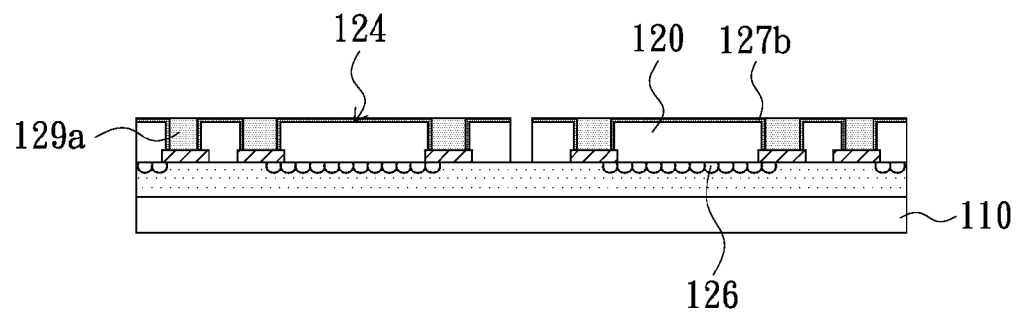

Referring to FIG. 1F, each of the through holes 127a is filled with a metallic layer 127c to form through silicon vias 127 electrically connecting to the bonding pads 126 correspondingly. The metallic layer 127c is electrically insulated from the pieced segments of wafer 120 by the dielectric layer 127b to prevent the through silicon vias 127 short to each other. Moreover, the metallic layer 127c extends to the back surface 124 of the pieced segment of wafer 120 from the through silicon via 127 correspondingly. In detail, a method of forming the metallic layer 127c includes the following steps. First, a metallic layer 129a is formed on the back surfaces 124 of the pieced segments of wafer 120 and is filled in the through holes 127a of the pieced segments of wafer 120, as shown in FIG. 3A. Second, a portion of the metallic layer 129a on the back surfaces 124 of the pieced segments of wafer 120 is removed, as shown in FIG. 3B. For example, the portion of the metallic layer 129a on the back surfaces 124 of the pieced segments of wafer 120 is removed by chemical mechanical polishing process.

Figure 4:
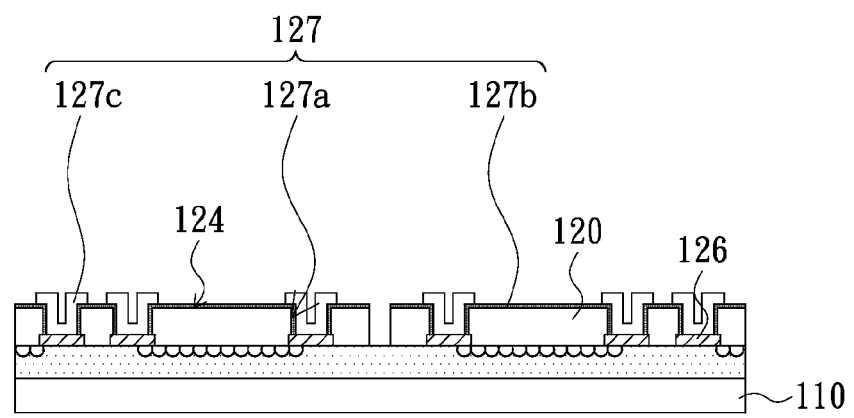
FIG. 4 is a cross-sectional schematic view of a semiconductor device at stages in a manufacturing process according to an embodiment of the present invention.

Referring to FIG. 1F again, a plurality of metallic patterns 129b is formed on the back surfaces 124 of the pieced segments of wafer 120 to electrically connect the metallic layer 129a. In other words, the metallic layer 127c is composed of the metallic layer 129a and the metallic patterns 129b. The metallic layer 129a and the metallic patterns 129b can be made by different materials. In other embodiment, the metallic layer 127c can be a single layer conformally filling into the through holes 127a, as shown in FIG. 4. Further, the metallic layer 127c can be made of high conductivity material, such as copper or aluminum.

Figure 1G:
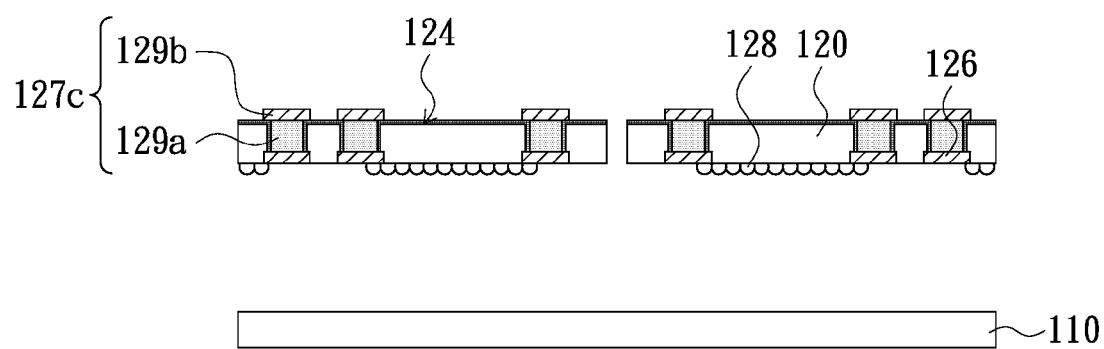

Specifically, in the embodiment, referring to FIG. 1G, after forming the metallic layer 127c, the pieced segments of wafer 120 are separated from the carrier substrate 110. A method for separating the pieced segments of wafer 120 from the carrier substrate 110 can be irradiating the adhering layer 130 by ultraviolet light, hot melting the adhering layer 130, mechanical stripping the adhering layer 130 or dissolving the adhering layer 130 by a solvent.

Figure 5:
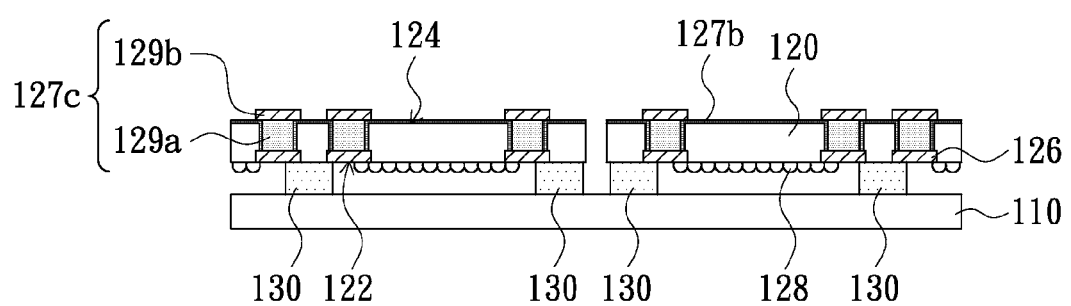
FIG. 5 is cross-sectional schematic views of a semiconductor device at a stage in a manufacturing process according to an embodiment of the present invention.

It should be noted that, in the embodiment, the adhering layer 130 spreads between the carrier substrate 110 and the pieced segments of wafer 120 completely. However, in other embodiments, the adhering layer 130 may be patterned to distribute between the carrier substrate 110 and the pieced segments of wafer 120, as shown in FIG. 5. As such, the adhering layer 130 may not be in contact with the semiconductor elements 128 on the active surfaces 122 of the pieced segments of wafer 120, and thus, the semiconductor elements 128 can be prevented from damage caused by removing the adhering layer 130.

Figure 1H:
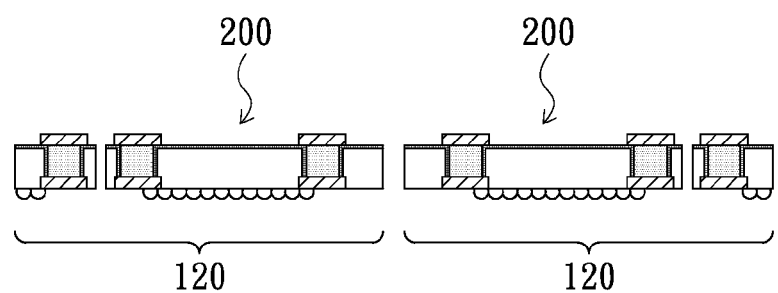

Referring to FIG. 1H, in the embodiment, after the adhering layer 130 is removed, the pieced segments of wafer 12 are cut to obtain a plurality of chips 200 for use in a subsequent packaging process. For example, the chips 200 can be CMOS image sensor (CIS) chips, MEMS chips, RF chips or other semiconductor chips made without stacking single chip, but the invention is not limited hereto.

In the method for manufacturing semiconductor device of the present invention, the pieced segments of wafer can come from the usable region of the wafer firstly, and then the pieced segments of wafer are adhered to the carrier substrate corresponding to the existing process equipment by adhering layer, so as to carry out the subsequent manufacturing process. That is the method of the present invention can carry out the subsequent manufacturing process only to the usable region of the wafer. Therefore, the production cost can be reduced, and the production efficiency can be enhanced.

Furthermore, the pieced segments of wafer can be adhered to the carrier substrate by the adhering layer having the temporary adhesive property, and before the pieced segments of wafer are cut to obtain the chips, the pieced segments of wafer may be separated from the carrier substrate firstly. As such, the carrier substrate can be used repeatedly, and thus the production cost can be further reduced.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing a semiconductor device, the method comprising:

forming an adhering layer between a carrier substrate and a first pieced segment of wafer and a second pieced segment of wafer, respectively, wherein the first pieced segment of wafer includes a first active surface, a first back surface opposite the first active surface, and a first bonding pad positioned on the first active surface, wherein the second pieced segment of wafer includes a second active surface, a second back surface opposite the second active surface, and a second bonding pad positioned on the second active surface, and wherein the adhering layer is patterned such that the adhering layer covers less than an entirety of the first active surface or the second active surface;

forming a via in the first pieced segment of wafer, wherein the via is electrically connected to the first bonding pad; and separating the first pieced segment of wafer and the second pieced segment of wafer from the carrier substrate.

2. The method of claim 1, wherein the first pieced segment of wafer comprises a semiconductor element disposed in the active surface, and wherein the adhering layer is patterned such that the adhering layer is not in contact with the semiconductor element.

3. The method of claim 2, wherein the semiconductor element comprises a micro lens array or a color filter array.

4. The method of claim 2, wherein the adhering layer does not contact the semiconductor element.

5. The method of claim 1, further comprising cutting the first pieced segment of wafer to create additional chips after said separating the first pieced segment of wafer and the second pieced segment of wafer from the carrier substrate.

6. The method of claim 1, wherein said separating the first pieced segment of wafer and the second pieced segment of wafer from the carrier substrate comprises at least one of irradiating the adhering layer by ultraviolet light, hot melting the adhering layer, mechanically stripping the adhering layer, or dissolving the adhering layer with a solvent.

7. The method of claim 1, wherein said forming a via comprises:

forming a through hole in the first pieced segment of wafer;

forming a dielectric layer on the first back surface of the first pieced segment of wafer and within the through hole;

removing a portion of the dielectric layer in the through hole to expose the first bonding pad; and depositing a metallic layer into the through hole to form the via, wherein the metallic layer is electrically connected to the first bonding pad.

8. The method of claim 1, wherein the wafer of the first pieced segment of wafer comprises a usable region and an undesirable region, the method further comprising cutting the wafer along an edge between the usable region and the undesirable region to obtain the first pieced segment of wafer.

9. The method of claim 1, wherein the carrier substrate is a transparent substrate.

10. The method of claim 1, further comprising thinning the first pieced segment of wafer before said forming a via.

11. The method of claim 1, wherein the wafer of the first pieced segment of wafer is a different wafer than the wafer of the second pieced segment of wafer.

12. The method of claim 1, wherein the wafer of the first pieced segment of wafer is a same wafer as the wafer of the second pieced segment of wafer.

13. The method of claim 1, wherein the adhering layer is formed on at least a portion of the first bonding pad and on at least a portion of the wafer.

14. The method of claim 1, wherein said forming an adhering layer between a carrier substrate and a first pieced segment of wafer and a second pieced segment of wafer, respectively, comprises rearranging the first pieced segment of wafer and the second pieced segment of wafer on the carrier substrate in an arrangement corresponding to an existing process equipment.

\* \* \* \* \*